(12) United States Patent
Kioussis et al.

(10) Patent No.: US 8,456,902 B2
(45) Date of Patent: Jun. 4, 2013

(54) GRAPHENE-BASED SWITCHING ELEMENTS USING A DIAMOND-SHAPED NANO-PATCH AND INTERCONNECTING NANO-RIBBONS

(75) Inventors: Nicholas G. Kioussis, Northridge, CA (US); Luis A. Agapito, Northridge, CA (US)

(73) Assignee: The University Corporation Inc. at California State University Northridge, Northridge, CA (US)

( * ) Notice: Subject to any disclaimer, the term of this patent is extended or adjusted under 35 U.S.C. 154(b) by 467 days.

(21) Appl. No.: 12/799,619

(22) Filed: Apr. 27, 2010

(65) Prior Publication Data

US 2011/0261605 A1    Oct. 27, 2011

(51) Int. Cl.
*G11C 11/14*    (2006.01)
(52) U.S. Cl.
USPC ........... 365/171; 365/157; 365/173; 365/174; 977/737; 977/774
(58) Field of Classification Search
USPC ................. 365/157, 171, 173, 174; 977/737, 977/774
See application file for complete search history.

(56) References Cited

U.S. PATENT DOCUMENTS

| | | | |
|---|---|---|---|
| 2009/0174435 A1 | 7/2009 | Stan et al. | |
| 2009/0226361 A1 | 9/2009 | Campos-Delgado et al. | |
| 2010/0047154 A1 | 2/2010 | Lee et al. | |
| 2011/0274928 A1* | 11/2011 | Liu | 428/402 |
| 2012/0196074 A1* | 8/2012 | Ago et al. | 428/64.1 |

OTHER PUBLICATIONS

Seungchul Kim, Jisoon Ihm, Young-Woo Son, First-principles Sudy on the atomic and the electronic structures of unreconstructed 6H-SiC {0001} surface and epitaxial graphene, Journal of the Korean Physical Society, vol. 55, No. 1, Jul. 2009 pp. 341-345.*
Graphene Nanoelectronics by R.M. Westervelt, vol. 320, Science Magazine, p. 324-325, Apr. 18, 2008.
Production, Properties and Potential of Graphene by Saldano, Mahmood and Dujardin, CEMES-CNRS UPR 8011, p. 1-57.
Topological Frustration in Graphene Nanoflakes: Magnetic Order and Spin Logic Devices by Wang, Yazyev, Meng, and Kaxiras, vol. 102, Physical Review Letters, p. 157201-1-1572, Apr. 17, 2009.

\* cited by examiner

*Primary Examiner* — Vu Le
*Assistant Examiner* — Han Yang
(74) *Attorney, Agent, or Firm* — Leonard Tachner

(57) ABSTRACT

The use of diamond-shaped graphene nano-patches as novel non-volatile switching elements exhibiting transitions between high and low conductance states based on changes of magnetic ordering of these states. Non-magnetic reconstructed graphene nano-ribbons are used as non-invasive leads to implement the switching elements as carbon-nanoflake based memories and transistors. Switching of the elements may be implemented by electric-field-induced altering of the magnetic state. Graphene nano-patch shapes of certain geometries provide passive electric-field sources such as to establish initial bits of information saved in graphene-based memories.

17 Claims, 15 Drawing Sheets

FIG. 1C diamond-8

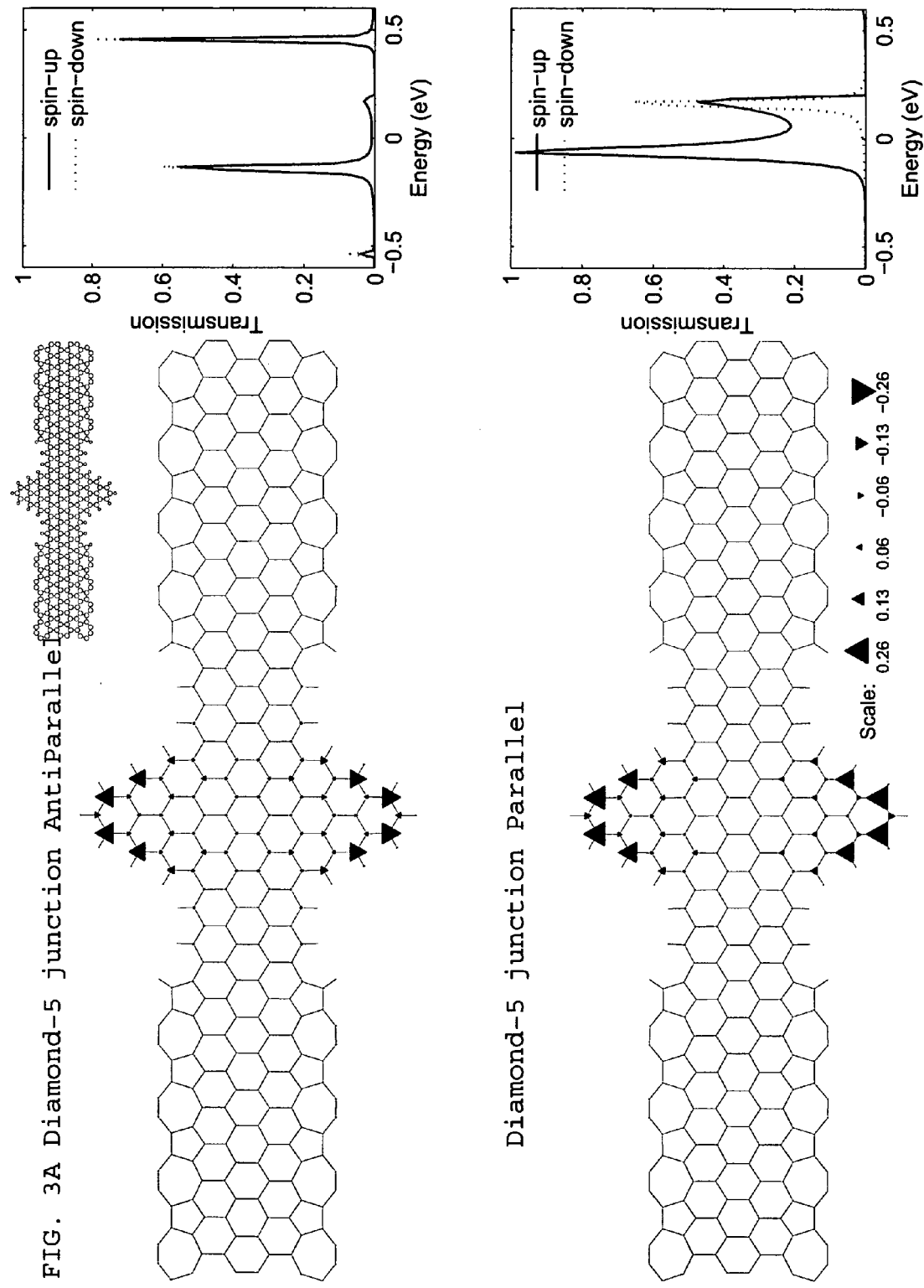
FIG. 3A Diamond-5 junction AntiParallel
Diamond-5 junction Parallel

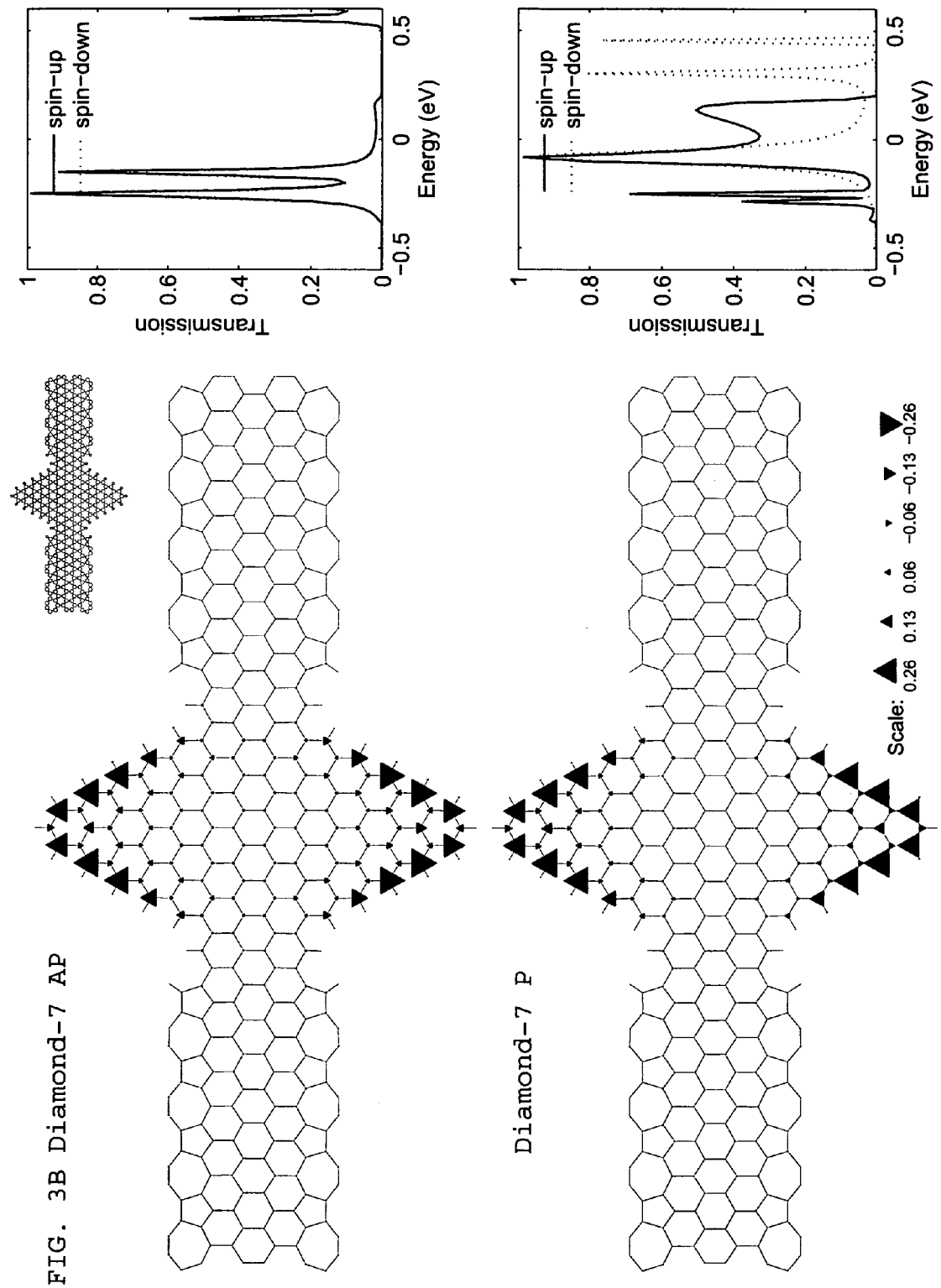
FIG. 3B Diamond-7 AP
Diamond-7 P

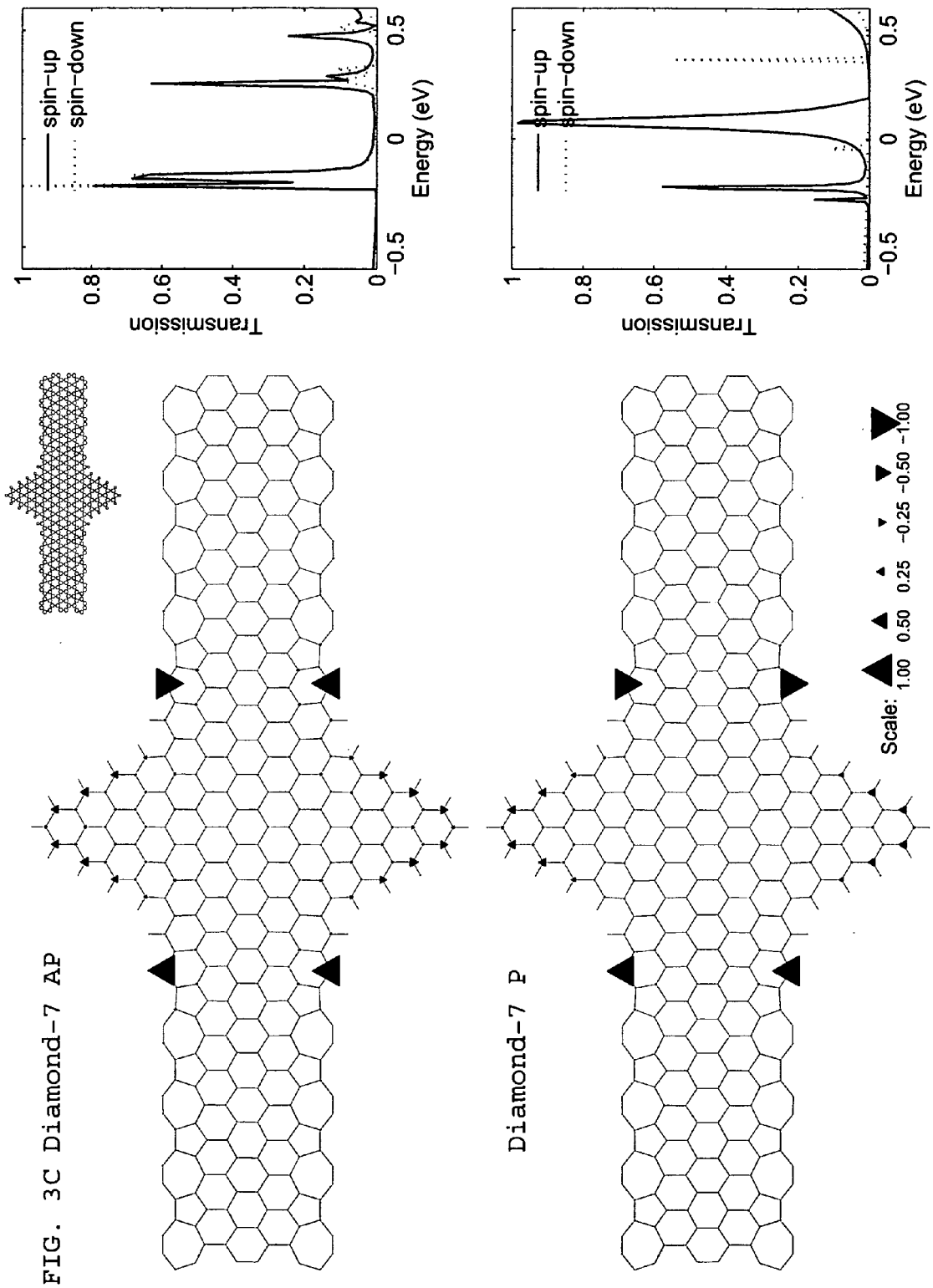
FIG. 3C Diamond-7 AP
Diamond-7 P

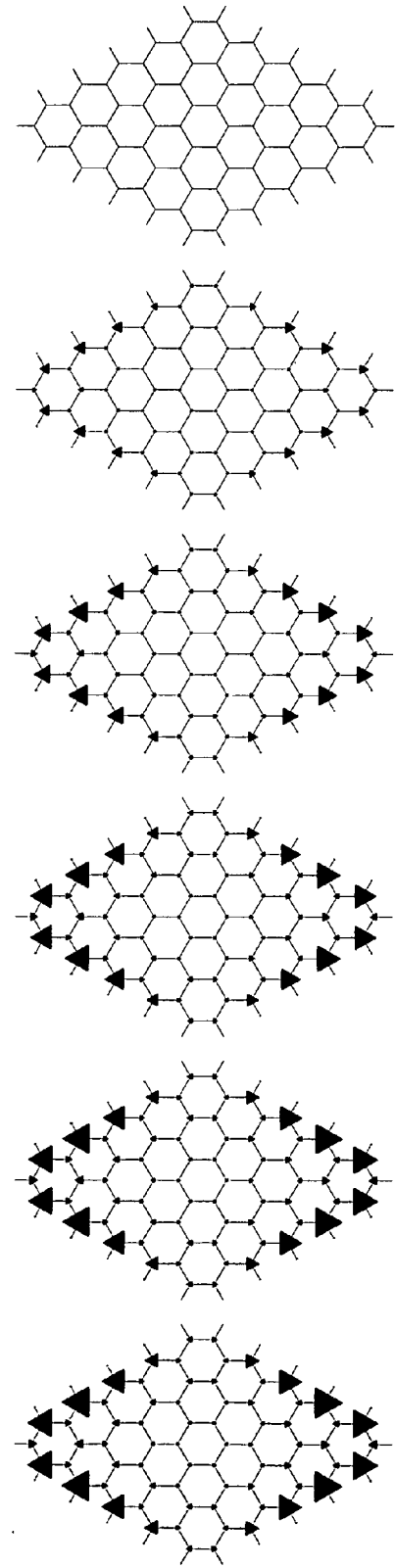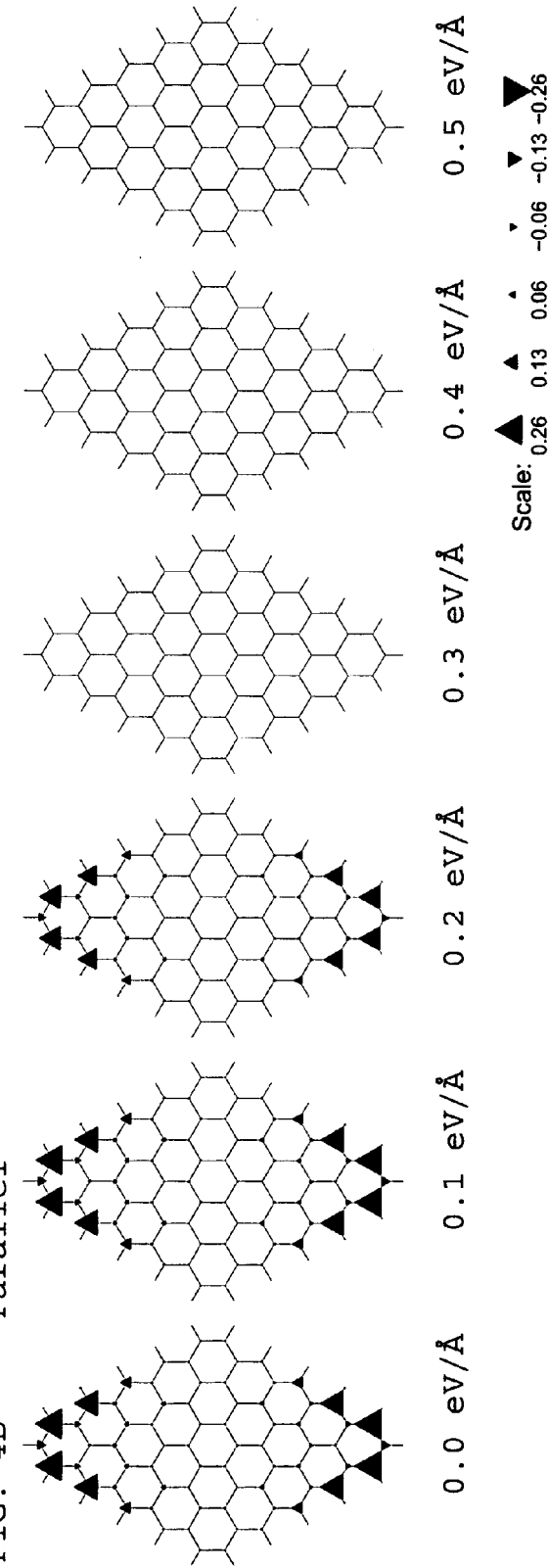
FIG. 4A AntiParallel
FIG. 4B Parallel

FIG. 6A
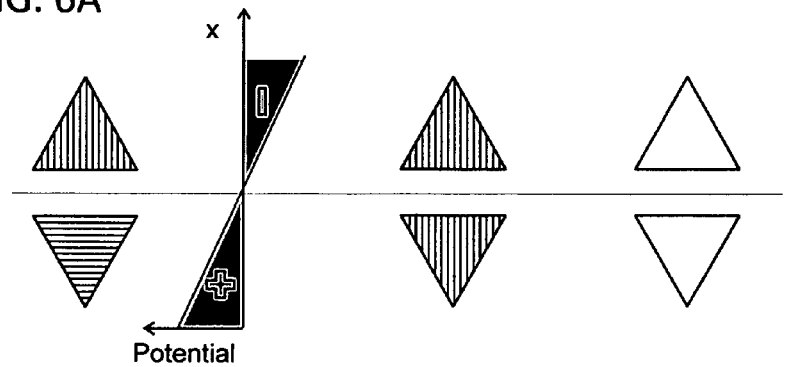
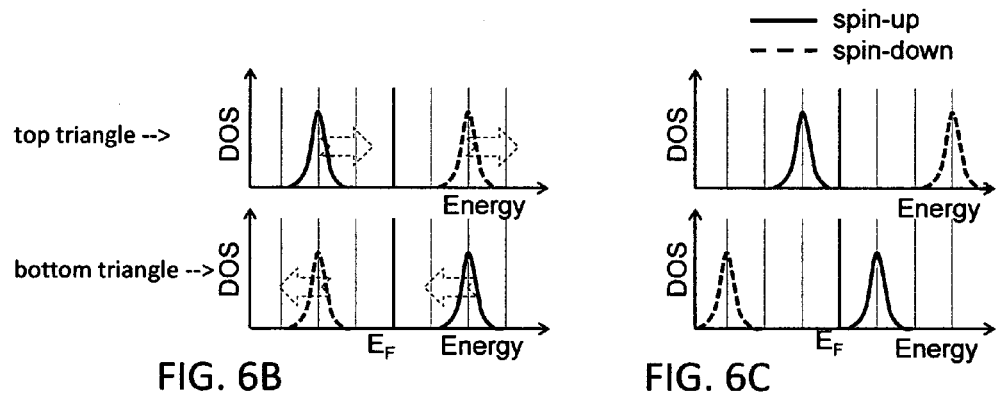
FIG. 6B  FIG. 6C
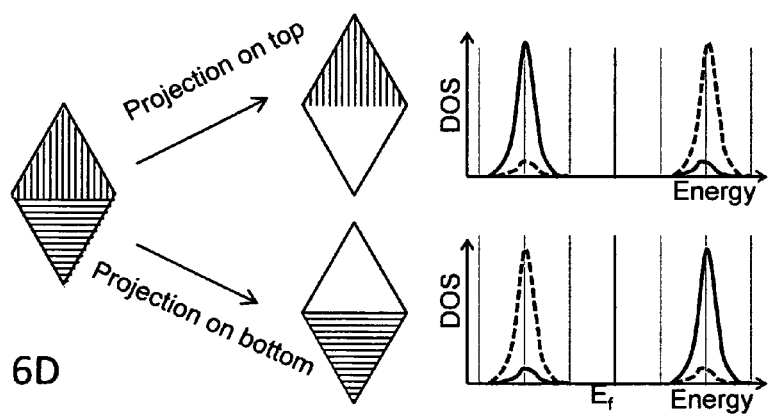
FIG. 6D

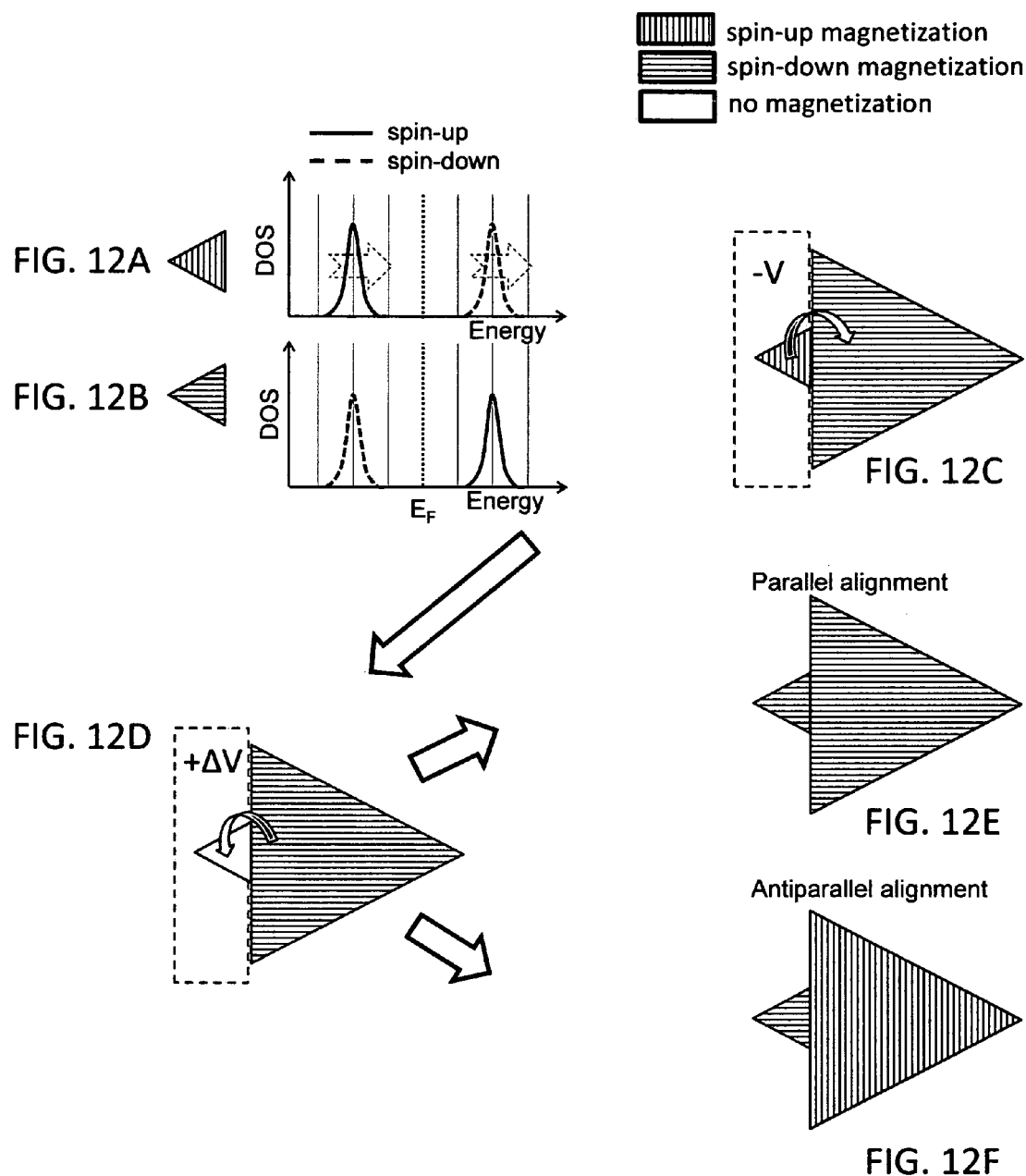

GRAPHENE-BASED SWITCHING ELEMENTS USING A DIAMOND-SHAPED NANO-PATCH AND INTERCONNECTING NANO-RIBBONS

BACKGROUND OF THE INVENTION

1. Field of the Invention

The present invention relates to the field of carbon-based electronic devices and more specifically to a diamond-shaped graphene nano-patch and interconnecting graphene nano-ribbons to achieve faster and higher density non-volatile magnetic switching units than currently available.

2. Background Art

Electrical switching units are at the core of the microelectronic industry. They are the minimum building blocks in logic (i.e. CPU's) and memory (i.e., RAM's) electronic chips. Consequently, research efforts in the industry are ultimately devoted to searching either for novel switching device units which go beyond the fundamental physical limits (i.e., Moore's law) of current silicon-based technology or for new embedding architectures that can enhance the performance of existing switching units.

Graphene is a one atom thick, two-dimensional sheet of carbon atoms arranged in a honeycomb lattice. Its methods of production, as well as its characteristics and application to the field of electronics, are thoroughly described in a paper entitled Production, Properties and Potential of Graphene by Saldano, Mahmood and Dujardin, CEMES-CNRS UPR 8011, pg. 1-57, which is hereby incorporated herein by reference.

The application of graphene to nano-electronics is discussed in an article entitled Graphene Nanoelectronics by R. M. Westervelt (Vol. 320 Science Magazine, pg. 324 to 325, 18 Apr. 2008) which is also hereby incorporated herein by reference. Another article of particular relevance to the present invention is entitled Topological Frustration in Graphene Nanoflakes: Magnetic Order and Spin Logic Devices, by Wang, Yazyev, Meng and Kaxiras (Vol. 102 Physical Review Letters, pg. 157201-1 to 157201-4, 17 Apr. 2009) which is also incorporated herein by reference. Relevant published U.S. patent applications include 2009/0226361; 2009/0174435; and 2010/0047154.

SUMMARY OF THE INVENTION

The present invention comprises a novel switching electronic unit based on carbon and a new interconnecting architecture that exhibits advantages over existing devices. These innovations will reduce manufacturing complexities and open a new technology that can provide many more decades of continuous improvement at a time when silicon-based technologies are coming to an end of Moore's law. Once this new technology is accepted, chip manufacturers will make a shift away from silicon into carbon-based electronics.

The switching unit and interconnects hereof are fully planar (up to a thickness of 1 atomic layer). Having three basic elements (diamond-shaped graphene nano-patches, interconnecting graphene ribbons and electric field sources) carved from a single carbon layer (graphene) represents a dramatic advantage over traditional microelectronic methods with respect to reducing manufacturing complexities and therefore increasing the yield of devices. For instance, currently manufactured CPU's exhibit over 1 billion switching units (silicon transistors) built within an area of half-an-inch square of a highly pure silicon wafer. All of the switching units are interconnected using a complicated maze of copper wires distributed throughout 12 layers above the plane of the silicon wafer.

One important advantage of the present invention is from the point of view of device density. Device density is related to fabricating (and interconnecting) as many switching units per unit are as possible, which translates to having more powerful CPU's or memories of higher storage capacities. Having a switching unit as simple as a mere diamond-shaped piece of carbon presents advantages over the more complicated switching units needed in current CPU's (2 silicon transistors per switching unit) and memories (6 silicon transistors per switching unit).

Applicants predict a number of unique magnetic and electric properties in "poker-diamond-shaped" graphene nano-patches (DSGNP), shown schematically in FIG. 1. Among other applications, the DSGNP may be used as a transistor (switching unit).

Graphene is a one-atom-thick, two-dimensional sheet of carbon atoms which exhibit unusual properties. The behavior of electrons in single graphene layers are paving the way for new kinds of electronic devices in the field of nanoelectronics. Graphene is composed of $sp^2$-bonded carbon atoms arranged in a two-dimensional honeycomb lattice.

The switching device of the present invention exhibits a number of unique magnetic and electric properties that Applicants have discovered to be associated with the "poker-diamond" shape for graphene nano-patches.

The diamond-shaped nano-patch represents the core of a switching-unit device, because it is responsible for the conductance switching of the device. Applicants have demonstrated that the underlying mechanism is as follows: The natural state (the so-called ground state) of the isolated DSGNP exhibits antiparallel alignment between the spins of its top and bottom sub-triangle components. This specific alignment opens an electronic gap at the Fermi level, rendering the nano-patch insulating. Consequently, the corresponding switching device is in its non-conducting (OFF) state. However, under small perturbations, the DSGNP can be brought into its other metastable states. Such as a parallel state, where the net spins of the top and bottom sub-triangle units are aligned in parallel (ferromagnetically) or a nonmagnetic state. Both these states have narrower energy bandgaps, and the DSGNP becomes more metallic, thus switching the device to its high conducting (ON) state.

It is important to emphasize that the conductance switching is based on the "magnetic ordering" of the subcomponents of the diamond, and it is not charge based. It is analogous to the well-known tunneling-magneto-resistance phenomenon. Once the device is perturbed to its nonmagnetic, parallel, or antiparallel states, it will remain there, saving the digital information encoded as "ON" or "OFF" without the need of applying energy. Therefore, it will perform, if used as a memory, as a magnetic RAM (MRAM), rather than static or dynamic (SRAM, DRAM) memory. MRAM's represent a fast growing market poised to displace other types of memories and have become the universal memory components because of their superior specifications.

The interconnects of the device are based on "reconstructed" graphene nano-ribbons previously reported in the literature to be metallic. These are the left and right interconnects. Applicants have discovered that the reconstructed zigzag nano-ribbons favor a nonmagnetic configuration in their ground state, as opposed to magnetic ordering exhibited by the unreconstructed zigzag nano-ribbons.

Furthermore, Applicants have discovered that the diamonds and the ribbons can be seamlessly integrated (in geometry and electronic properties) together without damaging the key electronic and magnetic properties of the diamonds. An embodiment of a switching unit of the present invention, is composed of a central diamond integrated to left and right interconnecting reconstructed nano-ribbons. This feature circumvents the use of external metallic leads (Au, Cu, Al) which introduce notorious interface-related problems that riddle the microelectronics industry. This discovery may be the most important from the practical point of view, since it allows for a higher degree of component-integration at the manufacturing level.

Applicants have also discovered that the magnetic alignment of isolated diamond-shaped nano-patches, and hence the state of switching unit, can be controlled by an electric field applied parallel to the main diagonal of the diamond. Furthermore, Applicants predict that the magnetic ordering can be controlled by the application of two gate voltages of different polarities to each sub-triangle component of the diamond.

Applicants have discovered that triangular-shaped nano-patches with unreconstructed edges exhibit small "electric dipole moments" that scale linearly with the size of the triangle. Hence, Applicants have engineered nano-patches of given shapes which act as passive sources of electric field.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which:

FIG. 3, comprising FIGS. 3A, 3B, and 3C, shows spin polarized electron transport through graphene diamond-shape nano-junctions of different size and interfaces. The left panels show the distribution of local atomic spin magnetization (defined as the difference between the local number of spin-up and spin-down electrons) for the antiparallel (AP) and parallel (P) states of the junction. The upward (downward) triangles represent the up (down) local spin magnetization of a given atom, where the size of the triangle is proportional to the magnitude of the local atomic magnetization, (the absence of a triangle denotes lack of magnetization). The right panels show the corresponding transmission for transport of spin-up (solid line) and spin-down (dotted line) electrons as a function of energy for the AP and P states.

FIG. 4, comprising FIGS. 4A and 4B, is a representation of the variation of the atomic spin-magnetization in a diamond-5 embodiment as a function of the externally applied electric field (in V/Å) for the AP and P states; the horizontal scale represents the excess (+) or defect (−) of the local spin-up electrons over spin-down electrons.

FIGS. 6A, 6B, 6C and 6D show magnetization in triangular and diamond-shaped nano-patches where A) shows three possible magnetic states for an uncoupled diamond with an applied external electric field; B) shows the DOS for the top and bottom uncoupled AP-state triangles, where spin-up (spin-down) states are denoted with solid (dashed) lines; C) shows that the peaks shift in opposite direction because of the opposite scalar potential the two triangular subunits experience resulting in half-metal like configuration; and D) shows the electronic structure of the coupled diamond;

FIG. 7, comprising

FIG. 12, comprising FIGS. 12A, 12B, 12C, 12D, 12E and 12F, is a representation of the control of magnetism in generalized diamond-shaped graphene structures via asymmetric gate voltages where A) and B) are the DOS of the smaller triangle depending whether it is spin-up or spin-down magnetized, respectively; C) is the antiparallel state for the generalized diamond and shows spin-up electrons being transferred to the larger triangle; D) shows the smaller subunit after losing its magnetization where spin-down electrons are being transferred into the smaller triangle; and E) and F) show two stable magnetic states after the smaller triangle has made a transition from its initial spin-up magnetization into its spin-down magnetization state; and FIG. 13, comprising

DETAILED DESCRIPTION OF PREFERRED EMBODIMENTS

1. Diamond-Shaped Graphene Nano-Patch (DSGNP) as a Switching Unit

A single diamond-shaped graphene nano-patch may serve as a novel switching unit (between ON/OFF) based on transitions between various magnetic states which exhibit dramatically different electrical resistance (impedance). In the absence of a gate voltage (or electric field) Applicants have predicted the existence of three stable magnetic states intrinsic to the DSGNP and related to its magnetic alignment, shown schematically in FIG. 1: (1) The lowest energy stable state (the so-called ground state) exhibits antiparallel (AP) alignment between the spin magnetizations (either spin-up or spin-down) of its top and bottom sub-triangle components. Consequently, the local magnetizations cancel out each other, resulting in a zero net magnetization for the entire diamond unit; (2) The second most stable state exhibits parallel (P) alignment between the spins of the two sub-triangles and hence the entire unit has a net magnetization, and (3) the least energetically stable state is the non-polarized (NP) spin state which has zero magnetization. The 3-state feature is analogous to those predicted for zigzag graphene nano-ribbons (zzGNR).

Each magnetic state is associated with different electrical properties. The AP state has the widest energy bandgap, the P state has the second largest bandgap, and NP the smallest one. The wider the band gap is the more insulating the electrical character. The bandgaps vary inversely proportional with the diamond size (measured by the number of benzene rings along its short diagonal). Table 1 shows values of the bandgap and the total energy relative to that of the AP state (which is the ground state) for the three states as a function of the diamond size, measured by the number n of benzene rings along its short diagonal side. Hereafter DSGNPs will be denoted more specifically by their size as "diamond-n".

TABLE 1

ENERGETICS FOR DIAMOND-SHAPED GRAPHENE NANO-PATCH

| Diamond size | Bandgap (eV) | | | Energy (eV) | | |
|---|---|---|---|---|---|---|
| | AP | P | NP | AP | P | NP |
| 5 | 0.769 | 0.392 | 0.229 | 0.000 | 0.116 | 0.210 |
| 6 | 0.762 | 0.257 | 0.099 | 0.000 | 0.154 | 0.459 |
| 7 | 0.703 | 0.285 | 0.041 | 0.000 | 0.138 | 0.689 |
| 8 | 0.657 | 0.266 | 0.014 | 0.000 | 0.139 | 0.957 |

Figure 1A:
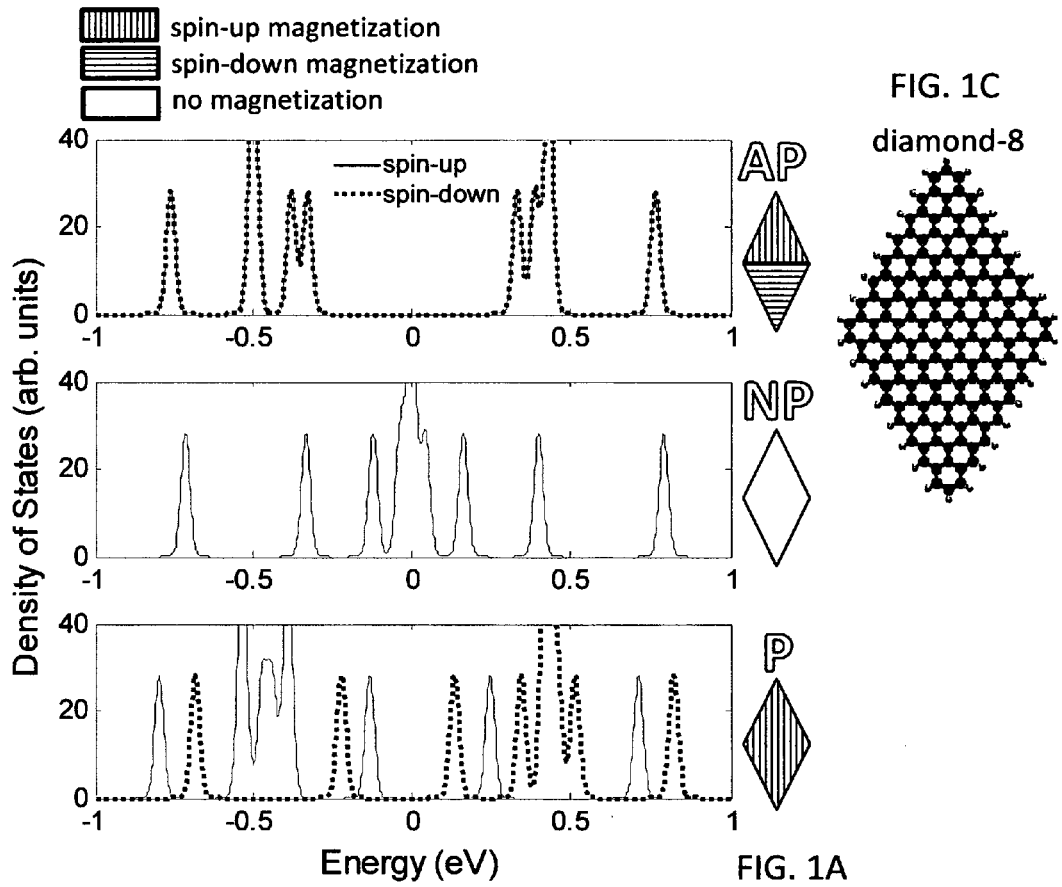
FIG. 1, comprising FIGS. 1A, 1B, and 1C, provides graphical representations of density of states (DOS) for A) the three magnetic states antiparallel, nonpolarized, and parallel (AP, NP, P) of an isolated diamond-8 embodiment and B) AP DOS projected on the top and bottom triangles of the diamond-8; C) is the molecular representation of a diamond-8, where the carbon and hydrogen atoms are shown in black and white respectively.
Figure 1B:
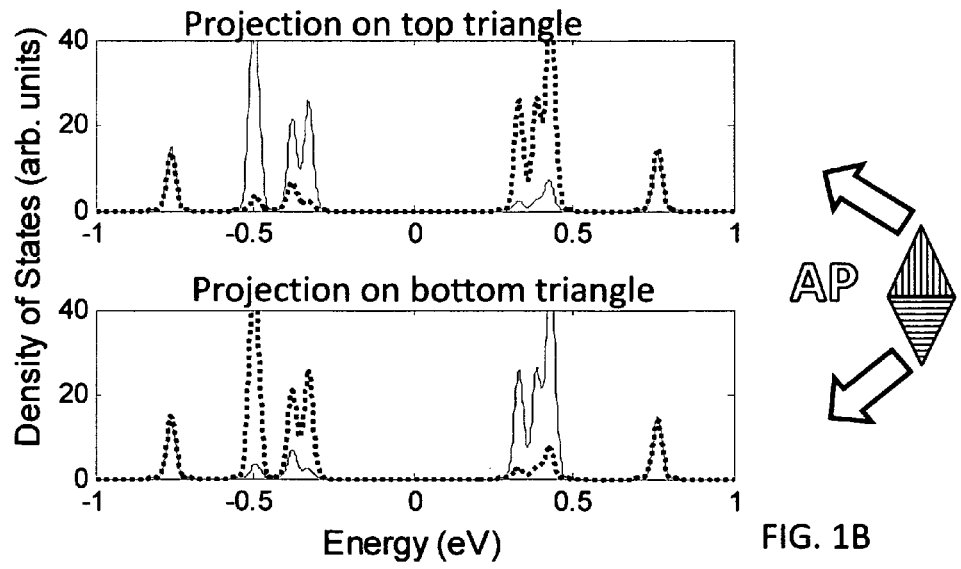

In general, the P and NP states, associated with smaller bandgaps, can be considered as the high-conductance states (ON, logic "1"), whereas the AP as the low-conductance state (OFF, logic "0"). FIG. 1 shows the density of states (DOS), which is a measure of the available quantum states at various energies, for the three magnetic states of diamond-8. One can clearly see that the energy gap of the AP state is larger compared to those of the P or NP.

1.1 Atomistic Origin of Magnetism in DSGNP

Figure 2:
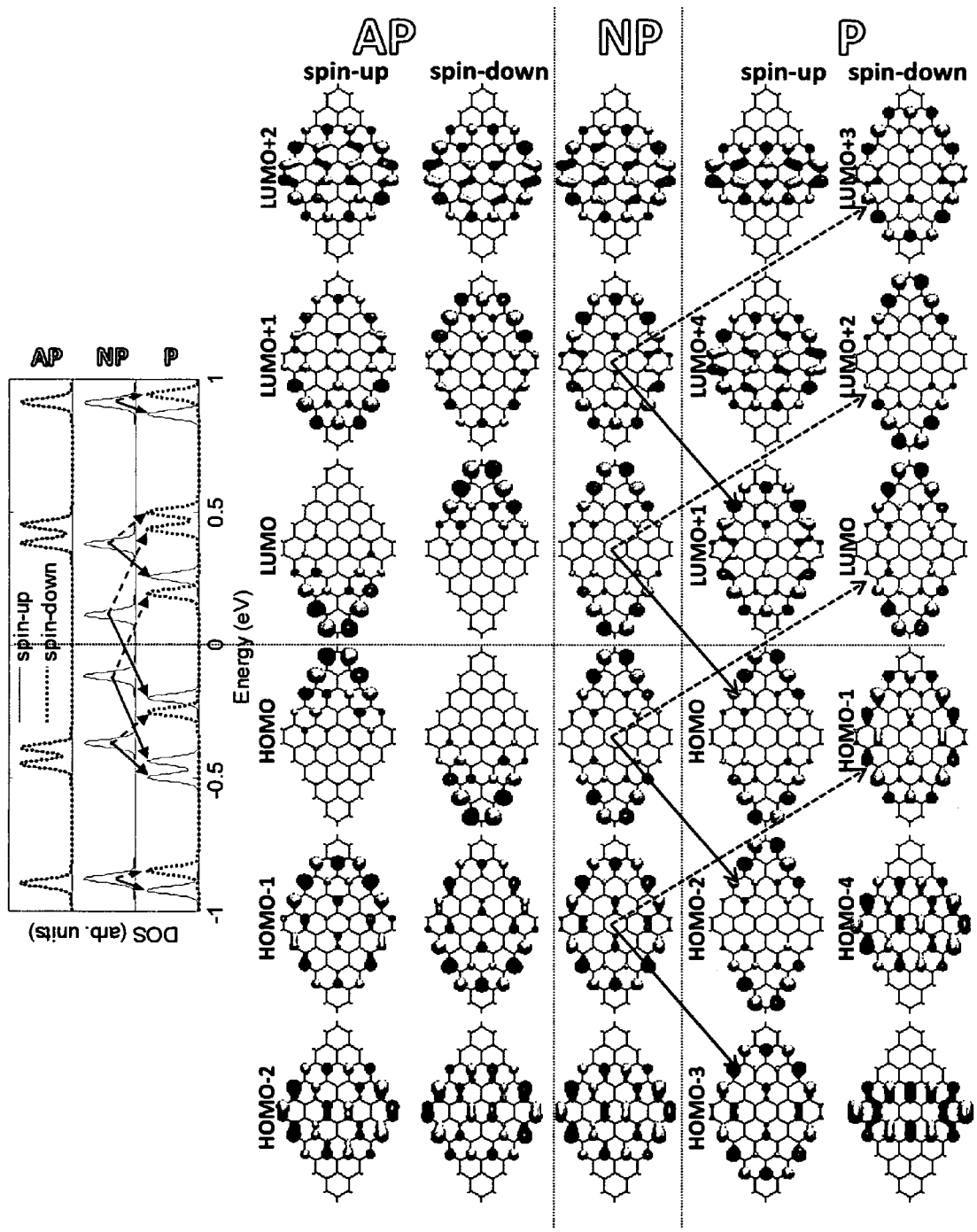
FIG. 2 is a graphical representation of molecular origins of magnetism in a diamond-5 graphene nanoflake; the left panel shows the DOS for the AP, NP, and P states. The right panel shows the molecular spin orbitals for the various occupied and unoccupied energy levels in the vicinity of the Fermi energy (at 0 eV) for three magnetic states.

The doubly-occupied spin-restricted wavefunctions for the diamond are symmetrically delocalized on the top and bottom subunits, as seen in FIG. 2 (P panel) for diamond-5. Once the spin restriction is lifted, in order to lower the Coulomb repulsion between electrons of different spin (spin-up ↑, spin-down ↓) occupying the same site (analogous to the phenomenological term $$U \sum_{i=l,l'} \hat{n}_{i\uparrow} \hat{n}_{i\downarrow}, U > 0,$$

$\hat{n}$ the number operator, and considering only two sites: l and l', the top and bottom subunits), their wavefunctions delocalize to different regions of space, avoiding each other. The resulting spin-unrestricted HOMO/spin-up and HOMO/spin-down orbitals occupy almost mutually exclusive regions of space (FIG. 2, AP panel), i.e. that the repulsion is strongest closest to Fermi level. This type of delocalization is the underlying origin of the antiparallel net magnetization alignment of the diamond.

Alternatively, lowering of the energy can be achieved without reshaping the spatial wavefunctions. Each energy level splits symmetrically (spin-up by $+\Delta\epsilon$ and spin-down by $-\Delta\epsilon$ as seen in FIG. 2 DOS panel), which would not change the electronic energy (sum of Kohn-Sham eigenenergies only) but for the HOMO and LUMO splittings crossing the Fermi level. Since this mechanism involves gaining (losing) one spin-up (spin-down) electron, the systems acquires a net spin-up magnetization which is distributed symmetrically in both subunits; therefore, yielding a parallel magnetization alignment. Similar to the case of isolated triangles, ferrimagnetism (and antiferromagnetism) in diamonds are primarily determined by the frontier molecular orbitals.

2. The Diamond-Shaped Nano-Patch as a Storage Cell

It is important to emphasize that the conductance switching is based on transitions between the various magnetically ordered states of the DSGNP, rather than the traditional charge-based switching. Once the device is placed into a given magnetic state, it will remain there, saving the digital information encoded as "ON" or "OFF" without the need of electrically refreshing the data. Therefore, these devices can be also used as memories. They are magnetic RAM (MRAM), rather than volatile RAM (SRAM or DRAM). MRAMs represent a fast growing market poised to displace other types of memories and become the universal memory components because of their superior specifications.

Indeed, entirely new devices and system architectures are possible with a new computational state variable such as the magnetization. Due to the collective interactions of magnetic moments in the P or AP states, energies of the order of $50 k_B T$, where $k_B T$ is the thermal energy at temperature T, may be sufficient to switch the state of the entire nanomagnetic device. In addition to significantly reduced power consumption, logic units based on magnetic moments have the added advantage that they can be non-volatile (when the power is removed the computational state is retained).

3. Use of Non-Magnetic Reconstructed Graphene Nano-Ribbons as Leads

Unreconstructed zzGNRs have been previously reported to exhibit local magnetism and to have small bandgaps. They have been proposed for carbon-based electronics. More recently, chemical reconstruction of the edges of the ribbon has been reported to give a more stable, self-passivated material, which, however, does not exhibit a bandgap. Applicants have discovered that these reconstructed zzGNR (r-zzGNR) favor a spin non-polarized configuration in the ground state (although the density functional theory calculations of reconstructed zzGNR allowed for magnetically polarized solutions, they converged to a spin non-polarized solution), as opposed to the well known magnetic ordering exhibited by the unreconstructed zzGNR.

More importantly, Applicants have demonstrated a unique feature which plays a crucial role for manufacturing purposes. The diamond-shape graphene nanoflakes and the ribbons can be seamlessly integrated (in geometry and electronic properties) within a single unit without inhibiting the magnetic/electronic properties of the diamonds. This feature circumvents the use of external metallic leads (Au, Cu, Al) which introduce notorious interface-related problems that riddle the microelectronics industry.

The absence of magnetization in the r-zzGNR leads is important for building a memory device. In an array of interconnected diamonds, the data is stored in the magnetic states of the diamonds.

3.1 Predictive Calculations for Switching Units and Memory

Applicants have studied several model geometries of switching junctions for proof-of-concept calculations. They all consist of a diamond-shaped graphene nano-patch connected to left and right r-zzGNR leads. FIG. 3A shows two magnetization states of a diamond-5-based junction. Upward (downward) triangles represent the spin-up (spin-down) magnetization of a given atom. The size of the triangular symbol is made proportional to the magnitude of the magnetization, with the absence of a symbol denoting lack of magnetization. One can note that both r-zzGNR leads remain mostly non-spin-polarized and the magnetism is associated solely with the AP and P states of the diamond graphene nanoflake. This result is crucial for memory applications, since it demonstrates that the bit of information stored in the diamond is not dissipating into the leads.

Furthermore, Applicants have carried out predictive ab initio non-equilibrium Green's functions (NEGF) calculations to determine the electrical conductance of the various magnetic states. As expected, the AP state of the junction shows lower electron transmission in the vicinity of the Fermi level (0.0 eV) compared to that of the P state, resulting in a higher conductance for the junction in its P state.

Consistently, Applicants have also found that the switching effect persists for junctions containing a diamond-7, as shown in FIG. 3B. In order to test the stability and robustness of the switching mechanism against interfacial geometry changes, Applicants have examined a different lead/diamond interface geometry, shown in FIG. 3C. In short, the calculations show that the switching effect of the invention is robust with respect to the diamond size and stochastic geometrical deviations typical of manufacturing processes.

4. Electric-Field Induced Modulation of Magnetization, Switching of Magnetic States, and Modulation of Energy Bandgaps Applicants have discovered that the magnetic state of the DSGNP, and hence its electrical character, can be controlled by an external field (or gate voltage) applied parallel to the main diagonal of the diamond.

4.1 Modulation of Magnetization

The presence of an electric field changes the initial magnetization of the diamonds. The spin magnetization of the diamond, initially placed in its AP ground state, progressively decreases with an increasing, externally-applied electric field. FIG. 4 shows the variation of the calculated spin magnetization for diamond-5 under external electric fields. Upward-pointing (downward) triangular markers represent the spin-up (spin-down) magnetization of a given atom. For the AP-state of the diamond-5, the spin magnetization vanishes at the critical field value of ~0.47 V/Å and the nanopatch undergoes a transition from the AP to the NP state, as seen in FIG. 4A.

Applicants predict a similar transition when the diamond is initially placed in its P state. In some cases however, Applicants found abrupt transitions. The critical electric field for the P→NP transition is consistently lower than for the AP→NP transition. For diamond-5 the P→NP critical field is ~0.25 V/Å, as seen in FIG. 4B. It is important to note the sharp P→NP transition in contrast to the smoother AP→NP transition.

4.2 Switching of Magnetic States

Figure 5:
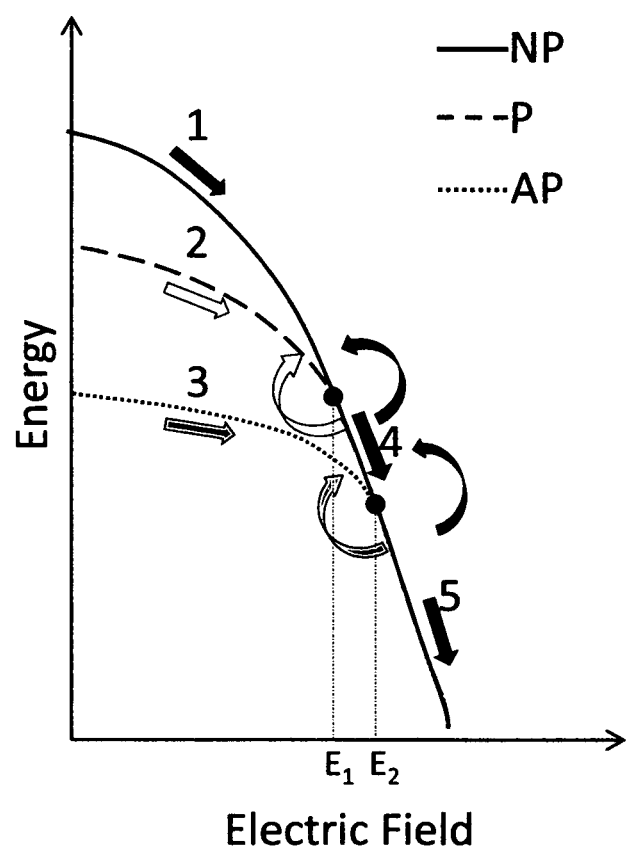
FIG. 5 is a graph of schematic variation of the total energy of the diamond-shaped graphene nanoflake versus external electric field for the antiparallel, nonpolarized, and parallel (AP, P and NP) states FIG. 6, comprising

The variation of the total energy of the DSGNP in the AP, P and NP states with external electric field, shown in FIG. 5, demonstrates controlled reversible transitions between the AP, P, and NP states. At zero field, the AP is the most stable (lowest energy) state followed by the P and NP states in ascending energy order. Upon increasing the external electric field, the energy difference between the three states is reduced and eventually the graphene nanoflake undergoes a transition to another magnetic state. More specifically, the P→NP transition takes place at electric field $E_1$, while the AP→NP takes place at a higher field $E_2$. For electric fields higher than $E_2$, the system remains in its NP state (actually, the calculations show that the system magnetizes again at much higher fields >3.0 V/Å) (within region 5) losing memory of its initial magnetic state.

The NP state (region 5) of the DSGNP, can be reversed into the AP, NP or P states with decreasing electric field; at $E_2$, the system may undergo a transition into either region 3 or region 4 depending on the variation rate of the electric field. If the field is reduced slowly (quasi-static variation), thus allowing the system to relax and follow the lowest-energy most favorable path, the nanoflake makes a transition into the AP state (region 3). On the other hand, a quick reduction of the field will not allow time for electronic relaxation, thus keeping the system in the NP state (region 4).

Similarly, the DSGNP placed in region 4 (NP) will undergo a second transition with decreasing electric field (at $E_1$), where the DSGNP can enter either in region 2 (P) or region 1 (NP) depending whether the field is changed quasi-static or abruptly.

4.3 Modulation of Energy Bandgaps

The electrical and optical properties of materials are dominated by their valence and conduction (close to the Fermi energy) energy bands (or frontier levels in the case of isolated molecules), which define their energy bandgaps. Therefore, control of the electrical and optical properties can be achieved by shifting the position of these energy bands. Control of the frontier levels in molecules has been investigated as a means for controlling the electrical conductance of molecular devices which can be consistently achieved in specifically engineered dimmer systems.

Applicants define a dimmer system to be a nanosystem comprised of two subunits, each of which is located in a different region of space. It is assumed that the electronic properties mainly depend on their highest occupied molecular orbital (HOMO) and lowest unoccupied molecular orbital (LUMO) energy levels of the nanosystem. If the subunits are electronically weakly coupled, they are more or less independent of each other, and the electronic structure of the entire system can be viewed as the superposition of the corresponding electronic structures of each subunit, which will be referred hereafter as the "additive" requirement. Building a dimmer system that complies with the "additive" requirement guarantees that the HOMO and LUMO of the whole system are localized on one or the other subunit of the nanosystem, but they do not extend over both. This interesting and crucial feature translates into building a system with electrically polar frontier orbitals (due to the wavefunction localization on a given subunit); the importance of polar orbitals is discussed below.

In general, a positive (negative) electrostatic potential lowers (increases) the energy of the molecular levels. The application of electrostatic potential of opposite polarity across the dimmer subunits will shift their respective levels in opposite directions as shown in FIG. 6B. Consequently, in such dimmer-like systems, the application of electric field is a general mechanism to control the bandgap; for example, the gap between the HOMO (spin-up, solid line) of the top triangle and the LUMO (spin-up, solid line) of the bottom triangle, shown in FIG. 6C.

If the subunits are magnetic, this mechanism allows tuning not only their electrical/optical properties, but also their magnetic ones, which are of special importance. Recently, it has been reported that some nano-patches of triangular shape made of graphene exhibit magnetism. Applicants use these triangles as subunits for building a dimmer-system prototype, i.e. the DSGNP.

The ground-state (lowest-energy state) of a triangle-shaped graphene nanoflake is magnetic, either with spin-up or spin-down magnetization. In addition there is also a non-magnetic state, although it is energetically less favorable. The magnetic properties of isolated diamonds are mainly due to the highest occupied and lowest unoccupied orbitals. The net magnetization is primarily due to the spin character of the HOMO level.

FIG. 6A shows the four magnetic states for an uncoupled dimmer (antiparallel, parallel, nonmagnetic). A constant electric field along the principal axis of the uncoupled dimmer generates a potential profile that is, on average, positive, on the lower subunit and negative on the upper one, causing the desired relative shift of the energy levels. For the uncoupled dimmer under constant electric field, one can note in FIG. 6C, that the spin-up peaks of the top and bottom triangle tend to merge while the spin-down peaks separate, yielding a half-metal-like behavior. The majority spin (spin-up or spin-down) can be selected by the direction of the field.

For a coupled dimmer, the results of the density functional theory (DFT) calculations confirm that the antiparallel magnetization is the most stable state, where the top subunit is predominantly of spin-up magnetization while the bottom is of spin-down magnetization. The resemblance of the projection of DOS and spin magnetization on the top and bottom subunits (FIG. 6D) with those of the uncoupled dimmer (FIG. 6B) confirms that the "additive" requirement is satisfied in the diamond shape nanoflake; in other words, the total magnetization is approximately equal to the sum of those of the two subunits.

As a consequence, the outlined mechanism for controlling the bandgaps (electrical and optical properties) of dimmers should be applicable to DSGNPs.

Figure 7A:
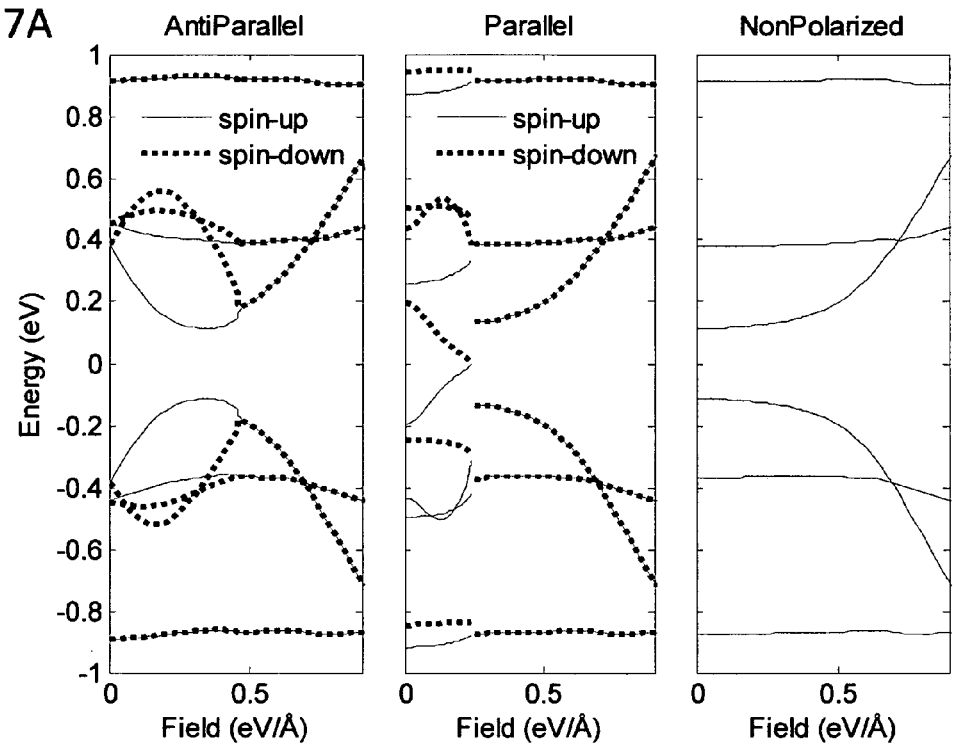
FIGS. 7A and 7B, is a graphical representation of the variation of spin-up and spin-down energy levels with electric field for the AP, P and NP magnetic states where A) corresponds to a diamond-5; and B) corresponds to a diamond-8 embodiment of the invention.
Figure 7B:
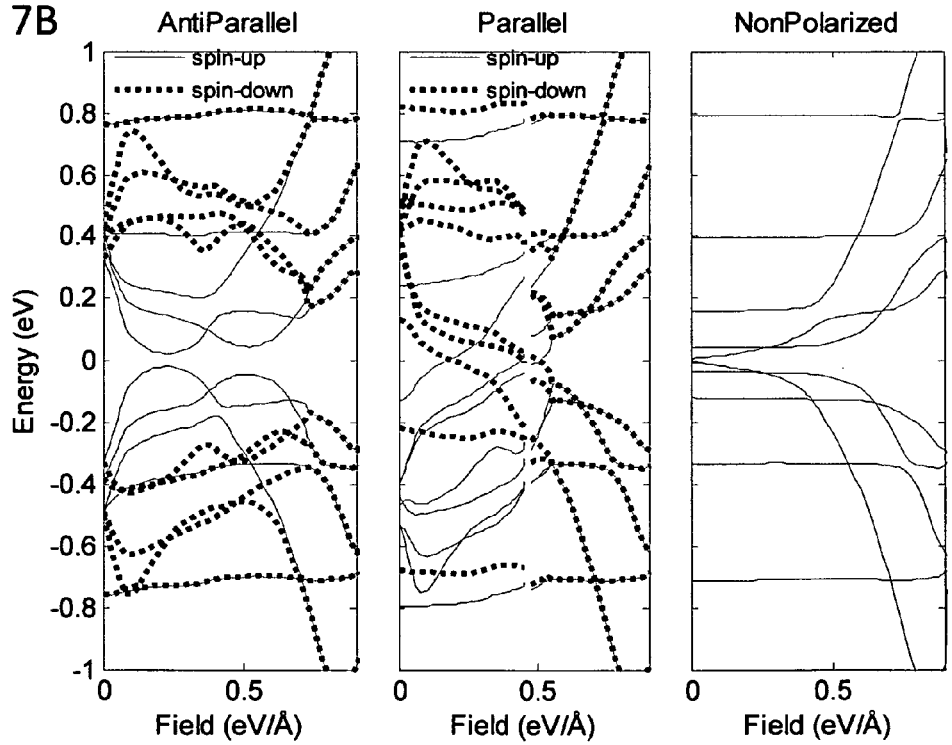

The DFT calculations confirm that and external electric field has a strong effect on the position of the energy levels for the AP, P, and NP magnetic states. Results of such calculations for diamond-5 and diamond-8 are shown in FIG. 7A and FIG. 7B, respectively.

Figure 8:
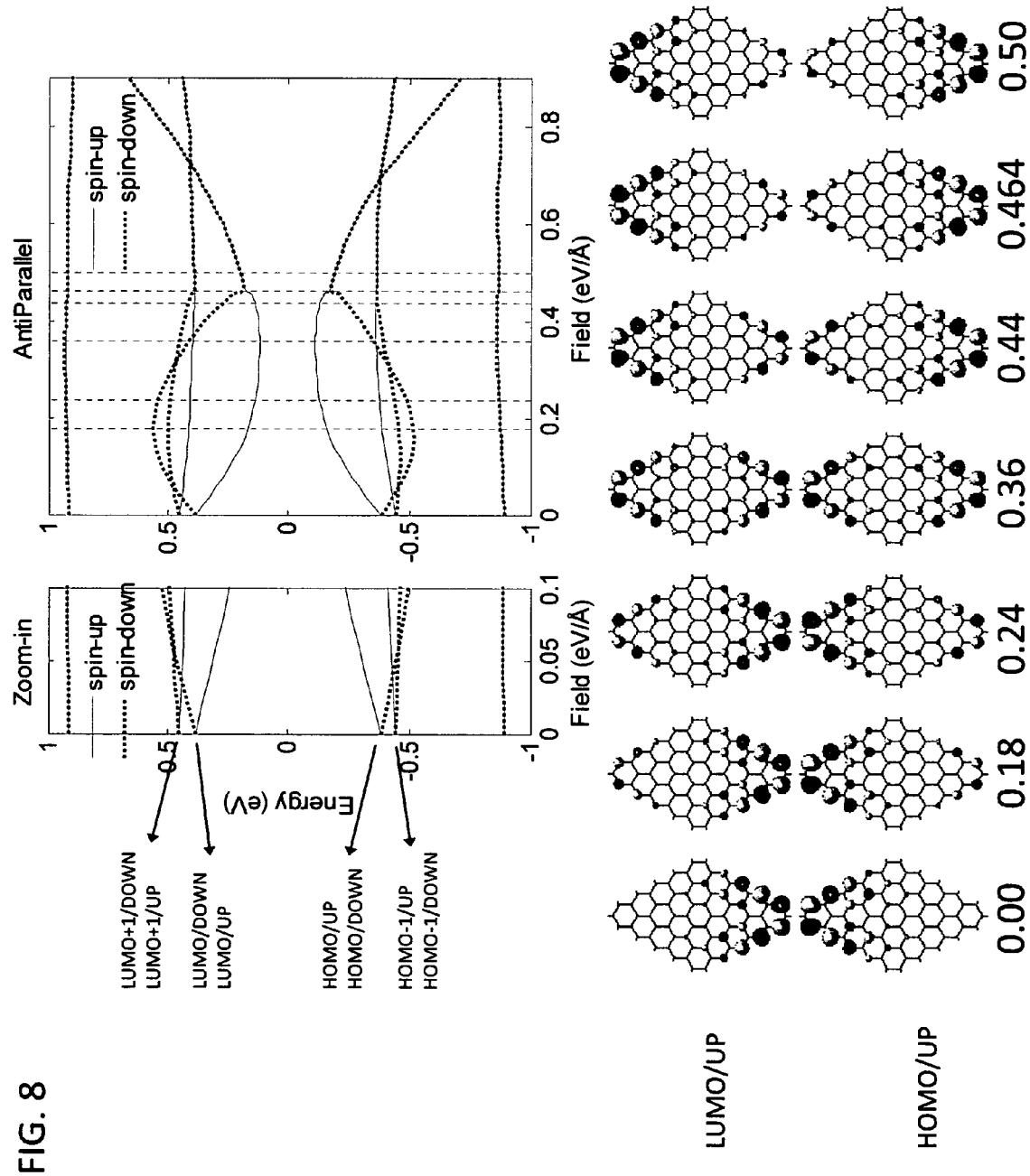
FIG. 8 shows the electric field dependence of the various energy levels for the AP-state of the diamond-5; the left panel shows a zoom-in region of the low-field behavior which is linear. The right panels display the spatial distribution of the spin-up highest occupied (HOMO) and spin-up lowest unoccupied (LUMO) molecular levels as a function of electric field in V/Å.

4.4 Underlying Mechanism 1: Linear Stark Effect, Control of Electrical and Optical Properties More specifically, the calculations for the AP state show a linear variation of the energy levels as a function of electric field, at least for low fields. The electric field removes the initial energy degeneracy of the frontier spin orbitals into bands of constant slope, as seen in FIG. 8 top left panel. This mechanism is known as the linear Stark effect $\Delta E = -\vec{\mu} \cdot \vec{E}$, in which the energy levels are shifted ($\Delta E$) according to their polarization ($\vec{\mu}$). The electrical dipole moment $\vec{\mu} \cdot$ is considered constant. As elucidated above, the HOMO and LUMO levels of the dimmer (DSGNP) are "designed" to exhibit net electrical polarization (dipole) which in turn acts as an "electronic handle" through which the levels can be selectively tuned. The direction and magnitude of the dipole determines its interaction with the field. The HOMO/UP orbital localized on the top subunit (FIG. 8, HOMO/UP panel) shows a negative dipole moment (pointing south, i.e. antiparallel to the direction of the applied field); accordingly, its corresponding band has a positive field slope (top left panel FIG. 8). The LUMO/UP orbital, on the contrary, has positive dipole moment and its corresponding band negative slope with field. Similar trend is observed for the HOMO−1 and LUMO+1 bands; however they have smaller electric field slope, which is consistent with the fact that these orbitals are less electrically polarized (less asymmetric, smaller dipole moment) than the HOMO and LUMO ones. Moreover, it is important to note that the bands associated with the electrically non-polar (zero dipole) orbitals, such as the HOMO−2 and LUMO+2 are almost independent of the electric field.

This novel electric field behavior Applicants found for DSGNPs can be viewed as the O-dimensional counterpart of the half-metallic-behavior predicted for infinite zzGNR (1-dimensional system). The DSGNP has the additional advantage of larger bandgaps, which is important in electronic applications and is lacking in zzGNRs.

4.5 Underlying Mechanism 2: Quadratic Stark Effect, Magnetic Properties

The linear Stark effect is clearly observed for an electric field less than 0.1 V/Å (top left panel FIG. 8). At higher fields, however, the bands deviate from linearity (top right panel FIG. 8), suggesting a field-induced change of the electrical polarization ($\vec{\mu}$) of the wavefunctions. In a dimmer model, it implies electrons spilling from one subunit to the other which is highly dependent on the chemistry of the dimmer. Because of its highly symmetric interface, a diamond dimmer allows for a smooth, continuous charge transfer between subunits. A diamond geometry allows maximum surface contact between both triangles, and thus a maximum exchange of charge. Exchange of charge between the subunits of the dimmer is crucial for the manipulation control of magnetism as will be explained below. Additionally, a compact geometry, such as that of the diamond, is significantly more practical from the fabrication point of view. Dimmers with asymmetric interfaces will inhibit a smooth charge transfer in favor of abrupt transfer of integer units of charge at a given threshold field.

Our DFT calculations confirm that the frontier wavefunctions (HOMO and LUMO) slowly start to depolarize at electric fields >0.1 V/Å (FIG. 8 HOMO/UP and LUMO/UP panels) and, consequently, the slope of the bands changes (FIG. 8, top right panel). At ~0.36 V/Å the wavefunctions become non-polar and the slope vanishes. Moreover, at ~0.44 V/Å, the polarity is reversed, resulting in negative slope and an increasing HOMO-LUMO gap.

Figure 9:
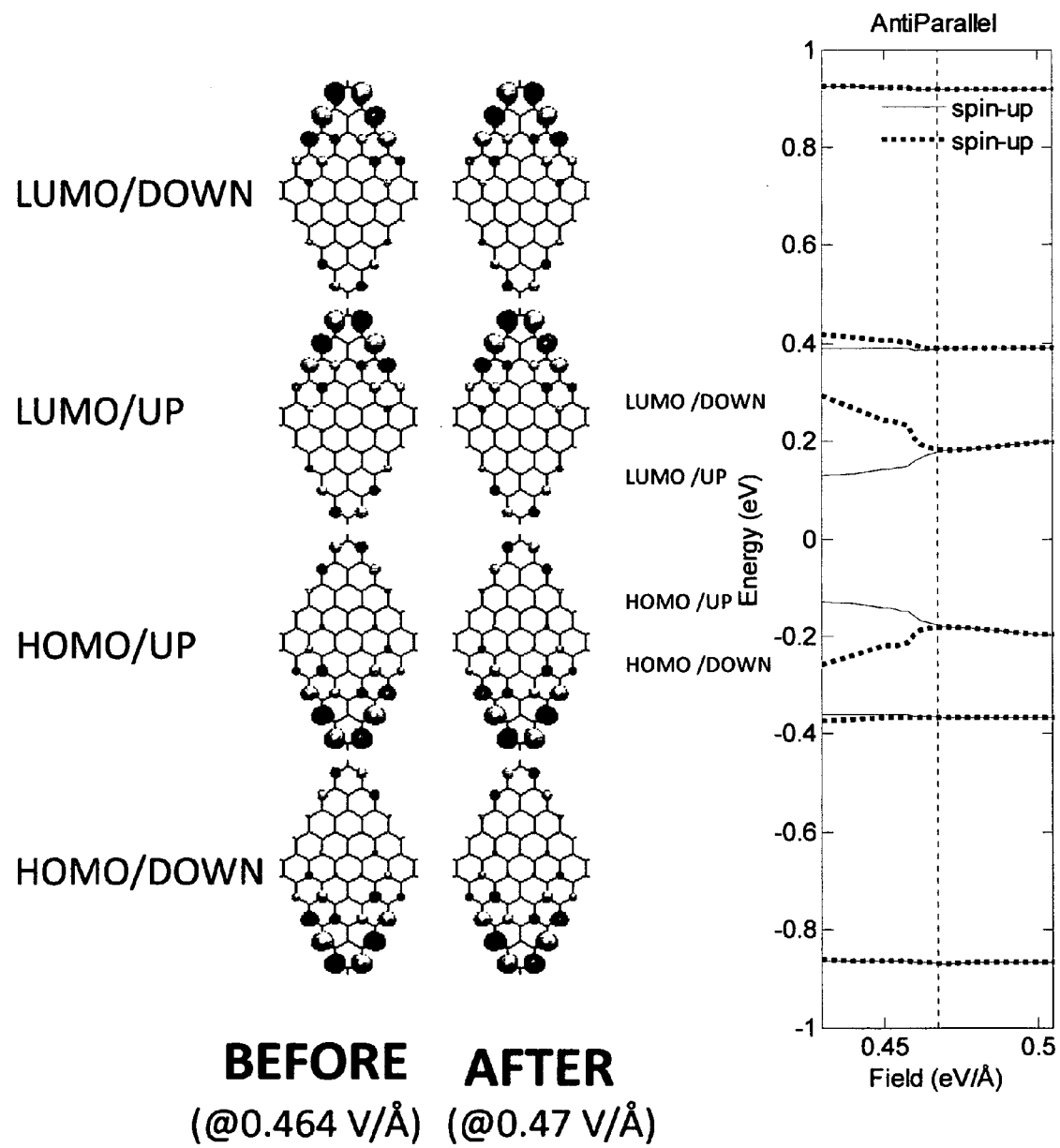
FIG. 9 shows the smooth transition from the AP to the NP state for the diamond-5 embodiment, where the right panel displays the variation of the energy bands with electric field in the vicinity of the transition point. The left panel shows the electric field variation of the molecular orbitals of the various energy levels around the Fermi energy.

At zero field, the HOMO/UP and HOMO/DOWN (and also the LUMO/UP and LUMO/DOWN) of the AP state are localized on opposite regions of space (FIG. 2 for diamond-5), which gives rise to local magnetism. Nonetheless, with field, as the HOMO/UP spatial wavefunction shifts to the bottom subunit, it increasingly matches the spatial distribution of HOMO/DOWN (which remains localized in the bottom subunit. In general for higher fields, higher-order effects appear to be predominant in the shift of the nonfrontier levels, possibly introduced by the screening of the frontier ones. For instance, it is observed that the HOMO/DOWN shifts opposite to what is expected from the linear Stark effect. This suggests that, being screened by HOMO/UP, the HOMO/DOWN level experiences a net effective field opposite to that of the applied field.) Spatial degeneracy induces energy degeneracy, as well, and the corresponding spin-up and spin-down bands start to merge. When the threshold field is reached (0.47 V/Å) the spin-up and spin-down occupied bands become degenerate in space and energy; therefore, any local magnetization vanishes and, although a spin-unrestricted calculation, the system enters and remains into a magnetically nonpolarized (NP) state (see right panel FIG. 9).

4.6 Underlying Mechanism 3: Molecular-Orbital Hybridization

Figure 10:
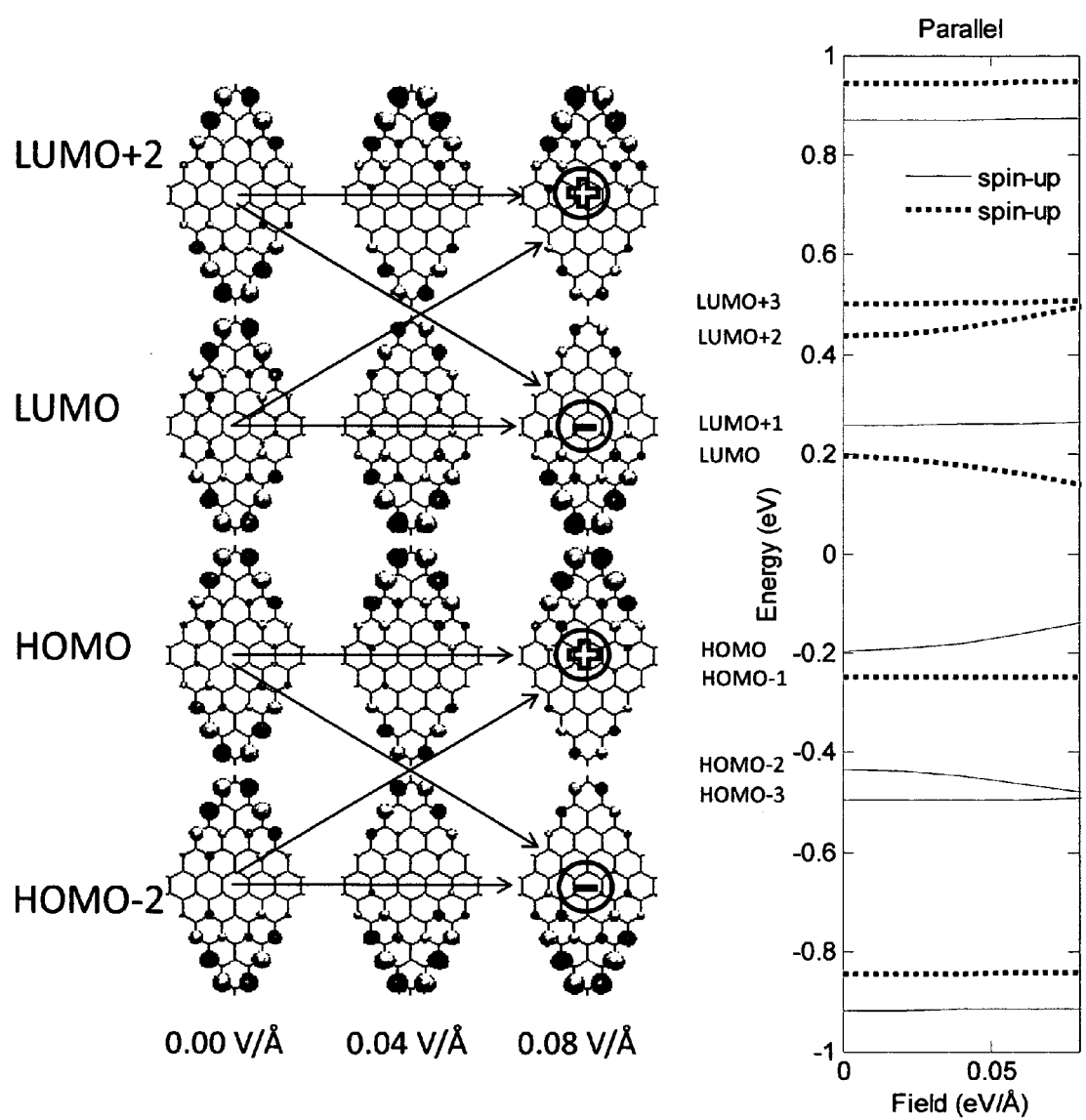
FIG. 10 shows the molecular orbital hybridization for the P-state diamond-5 in the low-field region (<0.08 eV/Å) and the evolution of the energy bands in this region.

As the Applicants have demonstrated, frontier molecular levels with net electrical polarity can be controlled by an electric field. However, the frontier levels in the P-state diamond are electrical non-polar in the absence of field, as seen in FIG. 2 P panel for diamond-5. Non-polar orbitals are insensitive to the effect of the field; nonetheless, Applicants have found that, in the P-state, one can still have electrical control of the magnetism. Because of the polarizing effect of the external field, a hybridization of nonpolar orbitals of opposite parity takes place at low fields and polar (bonding- and antibonding-like) orbitals are generated. For example, in the P-state of the diamond-5, the HOMO and HOMO-2 orbitals combine constructively (destructively) in the top (bottom) subunit, resulting in a polar HOMO (at 0.08 V/Å) with negative dipole moment, as shown in FIG. 10. A polar HOMO-2 with opposite dipole vector is also formed as the corresponding antibonding orbital; through the same mechanism, a polar LUMO is obtained. For higher fields, HOMO and LUMO bands move toward each other (according to the Stark effect) reducing the bandgap and eventually crossing the Fermi level at a given field. In general, for asymmetric diamonds, each frontier band crosses the Fermi level at a different point.

Figure 11:
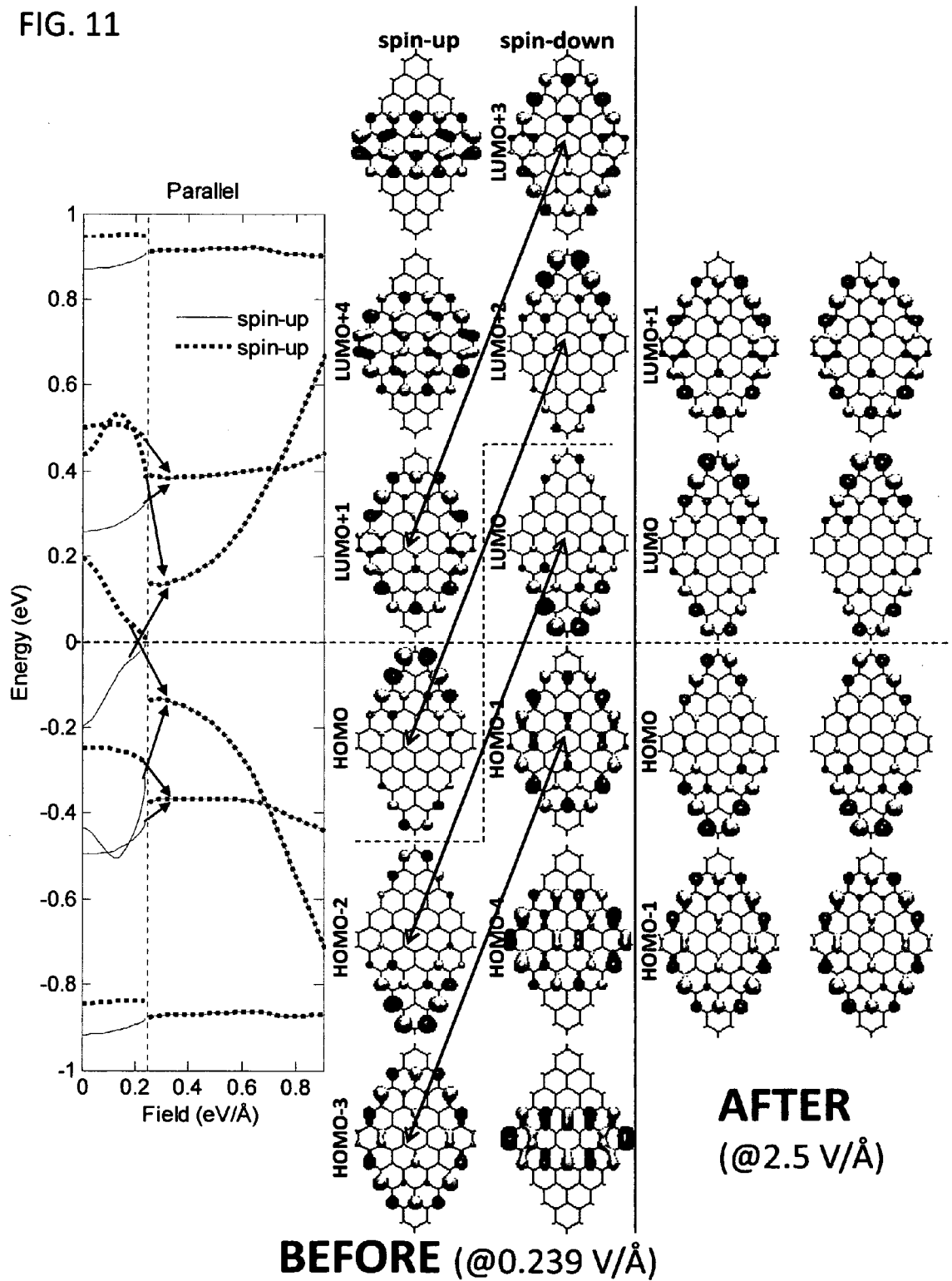
FIG. 11 shows the abrupt transition from the P to the NP state for the diamond-5 embodiment and the behavior of the energy bands around that transition point.

A characteristic feature of the diamond P-state is that the HOMO and LUMO bands are of opposite spin. The imbalance in the number of spin-up- and spin-down-occupied bands gives rise to a net magnetization of P-state diamonds; this is opposed to the AP case where the occupied bands are spin balanced, resulting in a zero net magnetization. Increasing the field causes opposite-spin bands to cross the Fermi level and, as the system looses (gain) one majority-spin (minority) electron, the net magnetization in the diamond progressively decreases until any spin magnetization is eliminated and the system enters into its NP state. For instance, the diamond-8 exhibits an excess of 6 majority-spin electrons ($S_z=3$) and the system undergoes three Fermi-level crossings before entering into its NP state (FIG. 7B). Diamond-5 exhibit $S_z=1$ and consequently needs only 1 Fermi level crossing (FIG. 11 at ~0.24 V/Å). While the bands always evolve smoothly with electric field for the AP and P cases, sharp transitions are consistently observed in the P-state (right at the Fermi crossing for diamond-5 in FIG. 11 at ~0.24 V/Å and between the second and third crossing for the diamond-8 in FIG. 7B).

In short, the previous three mechanisms explain, from the quantum-mechanical point of view, the modulation of spin magnetization via an external electric field shown in FIG. 4.

4.7 Use of Asymmetric Gate Voltages

The application of electric field or gate voltage (through gate plates) translates into the same physical effect. Therefore, magnetic alignment can also be controlled, more efficiently perhaps, by the application of two independent gate voltages of different polarities to each sub-triangle component of the diamond (asymmetric gating).

5. Generalized Diamond

A generalized version of the diamond structure uses the principles for the control of magnetism described previously. This generalized version emphasizes two features: 1) The subunits that compose the diamond need not be symmetric and also, 2) the electrostatic potential profile need not be symmetric on both subunits.

FIG. 12C shows the AP state of a generalized diamond where the sub-units are of different size and only the smaller sub-unit is under the effect of an external electrostatic potential (rectangular region represents a gate plate). FIG. 12A shows the DOS corresponding to the smaller triangle being spin-up polarized; FIG. 12B is the DOS when it is spin-down polarized. As in the symmetric-diamond case, the application of a negative gate bias voltage (-V) shifts up in energy the energy levels, and once the spin-up HOMO peak (solid line) crosses the Fermi level ($E_F$), the smaller triangle loses its excess of spin-up electrons becoming positively charged and non-magnetic (represented with white filling in FIG. 12D). It also loses memory of its initial magnetic state. The bigger triangle receives the extra electrons; however, assuming that it is large enough, it serves as an "infinite reservoir" of spin-down electrons and hence it remains unaffected. A positive gate potential ($+\Delta V$) will transfer back spin-down electrons from the reservoir into the smaller triangle. The smaller triangle becomes spin-down polarized, effectively flipping from its initial spin-up state. Finally, the generalized diamond may adopt either a parallel (FIG. 12E) or an antiparallel (FIG. 12F) magnetic configuration (AP is the energetically most favorable). One should be able to select each one by controlling the waveform of the applied bias voltage and the relative size of the triangles.

The generalized version is important because it suggests how to control the magnetic states in specific regions of a superstructure. A superstructure is a geometrical arrangement that may contain hundreds of subunits and carved out to perform specific logic operations using the spin degree of freedom. It is the magnetic analog of a computer's ALU (Arithmetic Logic Unit). Some superstructures have been discussed in the art but, thus far, it is unknown how to control the initial magnetic states of the inputs, which is where this invention may prove crucial.

6. Use of Graphene Nano-Patches Shapes as Sources of Electric Field

Applicants have discovered that engineered graphene nano-patches of certain geometries exhibit net electrical dipole moments. Thus, Applicants show a way to build electric-field sources embedded within the graphene circuit.

6.1 Underlying Mechanism

The basic underlying mechanism is the charge transfer (from a carbon to a passivating element) that takes place on each passivated carbon in the perimeter of the nanopatch. Hydrogen is commonly used in passivating dangling bonds, and will be used as the default passivating element hereafter. This is a consequence of the system reaching chemical equilibrium and is a general property that holds for any graphene-based system of any shape that contains passivated carbon. In those systems, each C—H bond becomes electrically polarized yielding small dipole-moment vectors aligned along the bond axis. This dipole is intrinsic to the C—H bond and its strength is almost independent of the nanoflake system size or shape. The net electric dipole moment of the entire nanosystem is simply the vector sum of the dipoles of the passivated carbon atoms along the perimeter edges. Thus, by controlling the number of passivated C atoms (size of the system, it scales linearly with the size) and their relative orientation (geometry of the system) the net electric dipole moment is engineered.

6.2 Proof-of-Concept Prototype

Figures 13A, 13B:
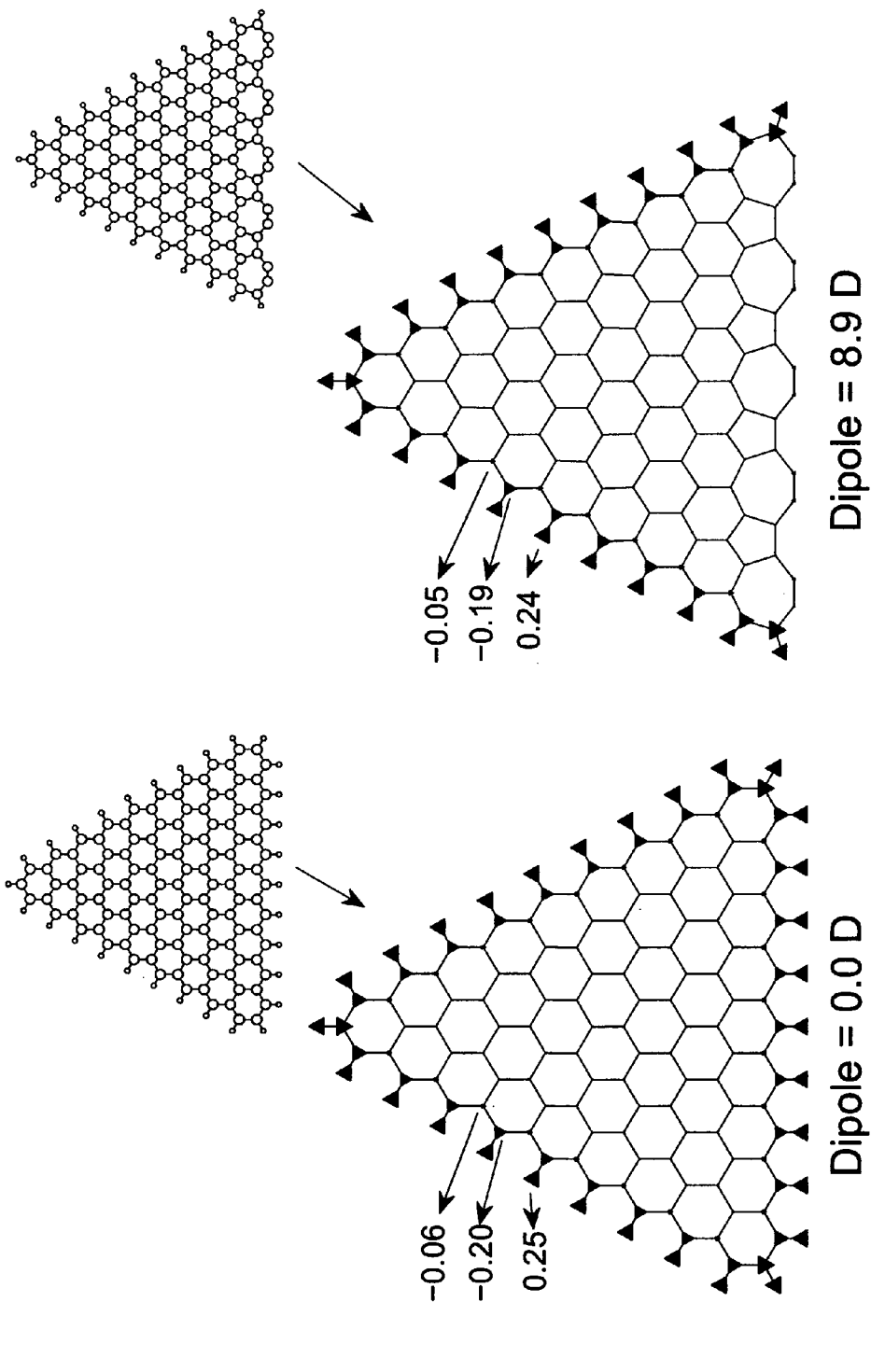
FIGS. 13A and 13B, shows excess (+, upward-pointing triangle) and loss (−, downward-pointing triangle) of net Mulliken charge per atom for a graphene triangle with zigzag hydrogen passivated edges, where in A) all of the edge atoms have been passivated with hydrogen and the net electrical dipole moment vanishes; and in B) the symmetry is broken by including a self-passivated (reconstructed) edge, resulting in a net electrical dipole moment of 8.9 Debyes along the X-axis. In the two inserted molecular geometries, the smaller circles represent peripheral hydrogen atoms and the larger circles carbon atoms. The units are in number of electrons.

Applicants have used two models to exemplify this generic property. The first model is an equilateral-triangle-shaped nano-patch with zigzag edges, as seen in FIG. 13A. The DFT calculations confirm the charge transfer from the perimeter carbon atoms passivated with hydrogen. The carbons have a net loss of 0.20 electrons (e) and the hydrogens a net gain of 0.25e. Nonetheless, because of the chosen specific symmetric geometry, the dipole vectors of the three edges cancel out each other, thus yielding a zero dipole moment for the entire nano-patch.

For the second model (FIG. 13B), Applicants have broken the symmetry by including a passivated edge, which, in turn, results in a net dipole moment for the system of 8.9 Debyes along the x-axis. Although there is some charge transfer at the passivated edge and on the second-outmost carbon front, these values are small (<0.6e) compared to those on the C—H bonds. The inner carbon atoms (further away from the edges) experience no charging.

By carving complex superstructures based on this principle, one can engineer graphene superstructures that generate customized electrostatic potential profiles in a given region of space. These specific regions can be used, for instance, as nanoscopic reaction chambers in which chemical reactions which are normally forbidden (or undesired) can be catalyzed (or inhibited), thus making possible specific synthesis of new materials. Also, this principle can be used to pin various initial quantum-states in different regions of a graphene-based computing device; or to set up the initial bits of information saved on graphene-based memories, similar to the mechanisms discussed above.

It will therefore be understood that the present invention provides an entirely new paradigm in the field of electronics wherein carbon-based switching elements provide new improvements in yield, density and speed not available in conventional silicon-based devices. Graphene nano-patches, having diamond shapes and employing graphene nano-ribbons having reconstructed-edge geometry, use magnetic state changes to achieve electrical-conductance switching from high to low and vice versa. These switching units may be employed in magnetic memory devices and processors, where the magnetic states may be controlled by the application of selected electric fields.

It will also be understood that while various embodiments of the invention have been disclosed to explain the features and structure of the underlying switching elements, the scope hereof shall be defined only by the appended claims and their equivalents.

We claim:

1. A nano-electronic switching device comprising a graphene patch having a diamond shape formed by a pair of opposed graphene triangular shapes sharing a common base, each having unreconstructed edges.

2. The nano-electronic switching device recited in claim 1 wherein said triangular shapes are geometrically identical.

3. The nano-electronic switching device recited in claim 1 further comprising a pair of device-interconnecting leads formed from graphene nano-ribbons integrally connected to said graphene patch.

4. The nano-electronic switching device recited in claim 1 wherein the conductance through said graphene patch is dependent upon the magnetization of said graphene triangular shapes.

5. The nano-electronic switching device recited in claim 4 wherein said magnetization is controlled by a potential difference applied to the pair of opposed triangular shapes.

6. The nano-electronic switching device recited in claim 4 wherein the magnetization of said graphene triangular shapes is controlled by the application of two independent potential differences of different polarities respectively to said graphene triangular shapes.

7. The nano-electronic switching device recited in claim 1 wherein said graphene diamond-shaped patch has at least two stable magnetic states dependent upon the relative magnetization of the respective triangular shapes.

8. The nano-electronic switching device recited in claim 7 wherein an antiparallel magnetic state produces the least conductance.

9. An electronic switch for selectively blocking and passing current, the switch comprising a diamond-shaped graphene nanoflake formed by a pair of opposed graphene triangles having a shared base and unreconstructed edges.

10. The switch recited in claim 9 wherein said triangles are geometrically identical.

11. The switch recited in claim 9 further comprising a pair of device-interconnecting leads formed from graphene nano-ribbons integrally connected to said graphene nanoflake.

12. The switch recited in claim 9 wherein the conductance through said graphene nanoflake is dependent upon the magnetization of said graphene triangles.

13. The switch recited in claim 12 wherein said magnetization is controlled by a potential difference applied to the pair of opposed triangles.

14. The switch recited in claim 12 wherein said magnetization of said graphene triangles is controlled by the application of independent potential differences to each of said graphene triangles.

15. The switch recited in claim 9 wherein said diamond-shaped graphene nanoflake has at least two stable magnetic states dependent upon the relative magnetization of the respective graphene triangles.

16. The switch recited in claim 15 wherein an antiparallel magnetic state produces the least electrical conductance through said switch.

17. A source of electric-field embedded in a nano-scale circuit; the source comprising:
a nanopatch graphene-based system having a plurality of interior carbon atoms arranged in a two-dimensional honeycomb lattice; and
a plurality of passivated carbon atoms along an exterior perimeter of said lattice and forming a plurality of electrically polarized bonds;
said bonds exhibiting electric-dipole-moment vectors aligned along an axis of each said bond, thus forming a net electric dipole moment based upon the number of and orientation of said passivated carbon atoms.

* * * * *